United States Patent
Scheer et al.

(10) Patent No.: US 6,358,860 B1
(45) Date of Patent: Mar. 19, 2002

(54) LINE WIDTH CALIBRATION STANDARD MANUFACTURING AND CERTIFYING METHOD

(75) Inventors: Bradley W. Scheer; Ellen R. Laird, both of San Jose, CA (US)

(73) Assignee: VLSI Standards, Inc., San Jose, CA (US)

(*) Notice: Subject to any disclaimer, the term of this patent is extended or adjusted under 35 U.S.C. 154(b) by 0 days.

(21) Appl. No.: 09/496,884

(22) Filed: Feb. 2, 2000

Related U.S. Application Data (63) Continuation-in-part of application No. 09/414,985, filed on Oct. 7, 1999, now abandoned.

(51) Int. Cl.$^7$ ............................................. H01L 21/302

(52) U.S. Cl. ..................... 438/745; 438/753; 438/756

(58) Field of Search ................................ 438/745, 753, 438/756; 356/376, 448; 430/30

(56) References Cited

U.S. PATENT DOCUMENTS

| | | | |
|---|---|---|---|
| 2,715,830 A | 8/1955 | Lewis et al. | |
| 3,505,861 A | 4/1970 | Schoefer et al. | 73/105 |
| 4,158,141 A | 6/1979 | Seliger et al. | |
| 4,158,414 A | * 6/1979 | Seliger et al. | 250/492 A |
| 4,386,850 A | 6/1983 | Leahy | 356/243 |
| 4,408,884 A | * 10/1983 | Kleinknecht et al. | 356/355 |
| 4,512,659 A | 4/1985 | Galbraith et al. | 356/243 |

(List continued on next page.)

FOREIGN PATENT DOCUMENTS

| | | |
|---|---|---|
| JP | 1-20428 | 1/1989 |
| JP | 4-289411 | 10/1992 |
| JP | 5-196559 | 8/1993 |

OTHER PUBLICATIONS

Martin et al., "Method for imaging sidewalls by atomic force microscopy," Appl. Phys. Lett., vol. 64, No. 19, May 1994, pp. 2498–2500.

Candela et al., "Film thickness and refractive index Standard Reference Material calibrated by ellipsometry and profilometry," SPIE, vol. 661, Optical Testing and Metrology, 1986, pp. 402–407.

(List continued on next page.)

*Primary Examiner*—Benjamin L. Utech
*Assistant Examiner*—Kin-Chan Chen
(74) *Attorney, Agent, or Firm*—Eric B. Meyertons; Conley, Rose & Tayon P.C.

(57) ABSTRACT

A method of making and certifying submicron line width calibration standards includes steps of thermal growth of a silicon dioxide film layer on top and vertical side wall surfaces of silicon regions, e.g. strips or mounds, that are formed over a silicon dioxide layer on a silicon substrate, then optically measuring the top film layer thickness, removing the oxide film from the top surface of the silicon regions via a planarization technique that protects the film on the side walls, and finally removing at least some, and in most cases preferably all, of the silicon material to leave just the oxide film that was on the side walls of the former silicon regions as submicron linear features, such as extended isolated lines or connected line segments arranged in a polygon. The width of these linear features is certifiable via cross-section testing of samples that have been formed by the film layer growth by means of scanning electron or atomic force microscopy to obtain a ratio of top-to-side film thicknesses, so that the lines on the standard are determined to have widths calculated from that ratio and the optically measured top film thickness. In an alternate embodiment, an atomic force microscope probe tip determining standard can be made using the same formation steps as the line width standard except that a silicon layer with [100] top surface instead of [110] top surface for the line width standard is used. Sloping side walls on the silicon regions result so that the oxide film layer will form tilted upwardly projecting blade features when the silicon material is partially removed.

44 Claims, 5 Drawing Sheets

U.S. PATENT DOCUMENTS

| | | | | |
|---|---|---|---|---|
| 4,597,665 | A | 7/1986 | Galbraith et al. | 356/237 |
| 4,615,762 | A | 10/1986 | Jastrzebski et al. | 156/628 |
| 4,636,073 | A | 1/1987 | Williams | 356/243 |
| 5,004,340 | A | 4/1991 | Tullis et al. | 356/243 |
| 5,169,488 | A | 12/1992 | Giuffre et al. | 156/643 |
| 5,198,869 | A | 3/1993 | Monteverde et al. | 356/243 |
| 5,332,470 | A | 7/1994 | Crotti | 156/659 |
| 5,383,018 | A | 1/1995 | Sadjadi | 356/243 |
| 5,520,769 | A | 5/1996 | Barrett et al. | 156/626.1 |
| 5,578,745 | A | 11/1996 | Bayer et al. | 73/1 |
| 5,599,464 | A | 2/1997 | Laird et al. | 216/2 |
| 5,607,800 | A * | 3/1997 | Ziger | 430/8 |

OTHER PUBLICATIONS

Patent Abstract for WO 99/08065, published Feb. 18, 1999.

Takacs et al., "A Step–Height Standard for Surface Profiler Calibration," SPIE vol. 1995 Optical Scattering, 1993, pp. 235–244.

Stover, "Requirements and suggestions for industrial smooth surface microroughness standards," SPIE vol. 2862, 1996, pp. 69–77.

Church et al., "Direct comparison of mechanical and optical measurements of the finish of precision machined optical surfaces," Optical Engineering, vol. 24, No. 3, May 1985, pp. 388–395.

Church et al., "The prediction of BRDFs from surface profile measurements," SPIE vol. 1165 Scatter from Optical Components, 1989, pp. 136–150.

Stover, "Roughness characterization of smooth machined surfaces by light scattering,"Applied Optics, vol. 14, No. 8, Aug. 1975, pp. 1796–1802.

Church et al., "Relationship between Surface Scattering and Microtopographic Features," Optical Engineering, vol. 18, No. 2, Mar. 1979, pp. 125–136.

Bullis, "Microroughness of Silicon Wafers," Electrochemical Society Symposium, May 1994, pp. 1156–1169.

Scheer, "Developing a haze and microroughness reference standard," MICRO, Jun. 1996, 10 pages.

Church et al., "Comparison of optical and mechanical measurements of surface finish," SPIE vol. 1531 Advanced Optical Manufacturing and Testing II, 1991, pp. 234–250.

Hitchman et al., "Calibration standards for surface profile monitors," J. Phys. E: Sci. Instrum., vol. 13, 1980, pp. 19–20.

Ohmi et al., "Calibration of height in atomic force microscope images with subnanometer scale silicon dioxide steps," Appl. Phys. Lett., vol. 61, No. 20, Nov. 1992, pp. 2479–2481.

*Handbook of Optics*, vol. I, © 1995 by McGraw–Hill, Inc., Chapter 7 entitled "Surface Scattering," by Church et al., pp. 7.1–7.14.

*Handbook of Optics*, vol. II, © 1995, 1978 by McGraw–Hill, Inc., Chapter 26, entitled "Scatterometers," by Stover, pp. 26.1–26.16.

* cited by examiner

LINE WIDTH CALIBRATION STANDARD MANUFACTURING AND CERTIFYING METHOD

CROSS REFERENCE TO RELATED APPLICATION

This is a continuation-in-part of U.S. patent application Ser. No. 09/414,985 filed Oct. 7, 1999, now abandoned.

TECHNICAL FIELD

The present invention relates to calibration of line width measuring instruments, and in particular to manufacture of a calibration standard containing line surface features thereon of a certified width. The invention further relates to calibration standards useful for determining the profile or shape of a line width measuring instrument's probe tip.

BACKGROUND ART

As integrated circuit features continue to shrink from 0.25 μm to 0.18 μm line widths and smaller, it has become ever more important that such feature dimensions can be measured precisely and accurately. As the feature sizes drop below the resolution limit for optical measuring techniques, more direct physical measurement, e.g. with a scanable probe tip, and in particular, atomic force microscopy, becomes the favored method. Atomic force microscopes (AFMs) are very precise, with excellent repeatability (when using the same machine and probe); but, without a way to calibrate these instruments, at the low end of their measurement range, they tend to be inaccurate, with different AFM instruments (or even the same instrument with different probe tips) yielding different results.

Line width calibration standards do exist, with the best standards available to date having a certifiable line width of greater than 0.7 μm. Thinner lines (0.25 μm and less) are desired, but production of such standards (especially those 0.10 μm or thinner) are impeded by resolution limits of the best available lithographic techniques and by the need to accurately measure the lines produced in order to certify the standard itself. Present line width standards typically depend on pitch and/or duty cycle measurements of a number of closely spaced lines on the standard to reach a 3 μm, 1.8 μm or the best 0.7 μm certified width, since it is much easier to accurately measure line plus spacings than the line width itself. Standards with isolated lines (with separations much larger than the probe tip dimensions) are desired, but at submicron dimensions it is generally understood that precise measurement of isolated lines would have to be made using an atomic force microscope or other probe-based instrument, the same type of measurement instrument that requires such a calibration standard in the first place. Traceability of a measurement standard is very important to guarantee accuracy. Traceability establishes a chain of reference back to an already recognized standard, whether of a national or international authority, or well established scientific first principles. In the case of isolated line widths, no such traceable standard yet exists.

Accordingly, it may be advantageous to provide a method of making certified submicron isolated line width standards for calibration of line width measuring instruments.

In addition, it may be advantageous to provide a method of certifying a submicron isolated line width standard that does not rely on probe-based direct physical measurement of the line width for its certification.

Furthermore, it may be advantageous to provide a calibration standard for probe-based instruments that is useful for determining the profile or shape of a line width measuring instrument's probe tip.

SUMMARY OF THE INVENTION

In an embodiment, a method of making and certifying a line width standard may include thermally growing a silicon dioxide film layer on a top surface and vertical side walls of one or more silicon strips or mounds formed over a silicon dioxide layer on a silicon substrate, optically measuring the thickness of the film layer on the top surface of the strip(s), removing the film layer from the top surface of the strip(s) without removing any of the film layer from the side walls, and removing at least some of the silicon of the strip(s) using an etchant that is highly selective of silicon relative to silicon dioxide, thereby leaving the silicon dioxide film layer from the side walls as two or more isolated silicon dioxide lines. The determination of the width of such silicon dioxide lines depends on knowing the ratio of the thicknesses of the film layer on the top and side wall surfaces of the silicon strips or mounds. This can be accurately found by testing samples made by the same process, e.g. by cross-section scanning electron microscopy of cut up test pieces. Note that only the ratio of these thicknesses is needed from the test samples, not the thicknesses themselves. Then, by optically measuring (e.g., by spectroscopic ellipsometry) the thickness of the film layer on the top surface of the standard being manufactured prior to its being subsequently removed, the side wall thickness can be calculated. This side wall thickness equals the line width of the finished standard.

In a second embodiment, if silicon top surface is chosen to be the [100] crystal plane, then the silicon strips or mounds can have sloping rather than vertical side walls. The silicon dioxide film layer can be grown as in the first embodiment, the top surface film selectively removed, and a portion of the silicon material also removed. This will leave isolated upward projecting, but tilted, silicon dioxide blade or fin-like members. The upper blade edge of these fin-like members forms a well-defined surface feature over which an atomic force microscope probe tip may pass to produce a probe signal representing the shape of the probe tip. This allows the probe tip shape to be characterized and taken into account when passing over surface features of unknown characterization.

In either embodiment, the oxide features may not only form parallel pairs of isolated extended lines but can also assume other linear shapes, such as square, rectangular, parallelogram or octagonal perimeter features to permit calibration or probe characterization in two or more orthogonal or diagonal directions, as needed by the particular system being calibrated using the standard. Multiple features may be arranged on the surface of the standard in an array or grid, concentrically, or in any other convenient layout.

BEST MODE OF CARRYING OUT THE INVENTION

Figure 1A:
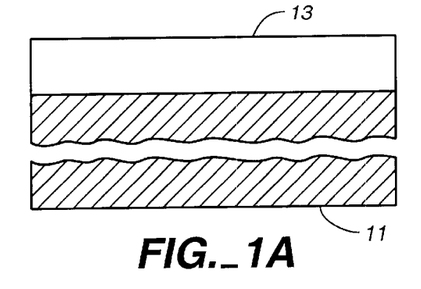
FIGS. 1A–1F are side sectional views showing a manufacturing process for a certified line width standard of the present invention.
Figure 1B:
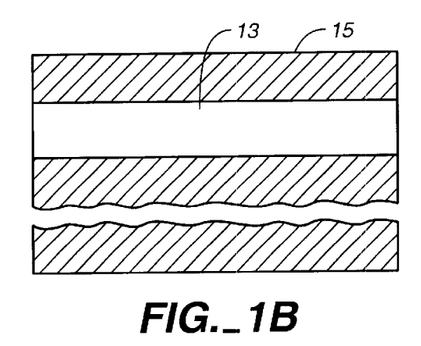

With reference to FIGS. 1A–1F, a line width calibration standard is manufactured and certified by the following process steps. In FIG. 1A, starting with a silicon substrate 11, a silicon dioxide layer 13 is thermally grown over a top surface of the substrate 11. Then, as seen in FIG. 1B, a [110] silicon layer 15 is deposited or bonded over the silicon dioxide layer 13, which is typically grown to about 5–250 nm thickness, and the silicon layer 15 is typically deposited to about 100–1000 nm thickness. These thicknesses are exemplary only and can vary somewhat. For example, silicon layer 15 can be as thin as about 20 nm.

Figure 1C:
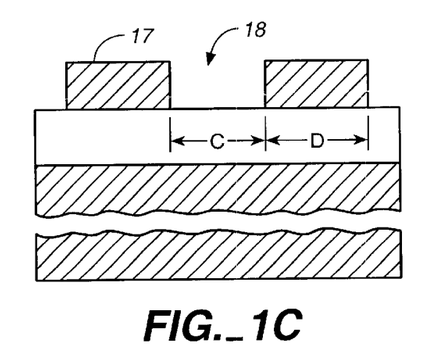

Selected portions of the silicon layer 15 are next defined using ordinary photolithographic techniques and subsequently etched to form one or more silicon strips 17 separated by regions 18 where the silicon layer has been completely removed, as seen in FIG. 1C. The silicon strips 17 have a width D of at least about 20 $\mu$m, and more typically about 10 mm, and are spaced apart from any other silicon strips by the regions 18, with the spacing dimension C ranging from at least about 20 $\mu$m up so to a few millimeters, and more typically being about 100 $\mu$m spacing. The spacing and width requirements are mainly intended so that the final line structures (lines 20 in FIG. 1F) of the finished standard are farther apart than the effective lateral dimensions of the probe (typically about 0.1 to 5 $\mu$m diameter) of the line width measuring instrument to be calibrated with the standard. In place of extended strips 17, square or rectangular mounds or other polygonal raised features can also be formed, as further described below. Another aspect of the etching is that the resulting silicon strips 17 have vertical side walls, rather than sloping side walls.

This is achieved by having the top surfaces of the silicon layer be the [110] crystal surface plane rather than the more usual [100] crystal plane. An etchant that exhibits orientation-dependent etching properties in silicon is used (such as a mixture of 20–25% potassium hydroxide (KOH) and 10–15% isopropyl alcohol in water, or a tetramethylammonium hydroxide (TMAH)-based etchant). The vertical side walls are along the [111] crystal surface plane of the silicon.

Figure 1D:
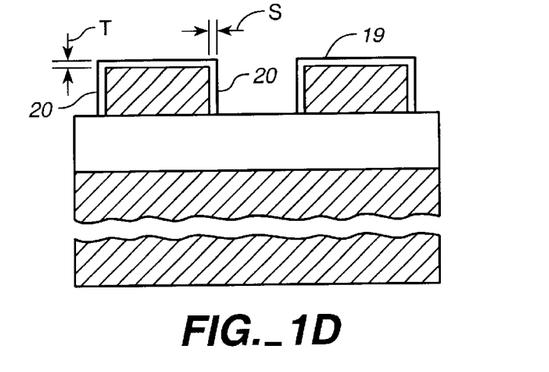

After defining the silicon strips 17, a thermal oxide regrowth step is conducted to form a very thin silicon dioxide film layer 19 and 20 on both the top and side wall surfaces of the silicon strips 17, as seen in FIG. 1D. The thickness of the top oxide film surface 19 is typically in a range from 5 to 250 nm, but could be as thin as about 2 nm or as thick as 500 nm. Preferably, a dry oxidation technique at 750–1000° C. and reduced pressures (<2 torr) is used for reduced growth rate and better control of the oxide growth process. As the [111] side wall silicon surfaces have more oxidation sites than the [110] silicon top surface, the thickness S of the side wall oxidation 20 cannot be expected to equal the thickness T of the top oxide film 19. However, the side wall oxide film thickness cannot be measured directly without destroying the sample. Accordingly, what is needed for certification of the eventual standard is a knowledge of the ratio T/S of the top to side wall film thicknesses and an accurate measurement of the top film thickness T. The ratio is determined by destruction testing of a number of samples made by the steps in FIGS. 1A–1D. In particular, the cross-section seen in FIG. 1D is examined by atomic force microscopy (AFM), scanning electron microscopy (SEM), or transmission electron microscopy (TEM). Note that while a calibrated SEM, TEM or AFM instrument is always preferred, the value obtained will not depend on the instrument's accuracy (only its precision) because it is the ratio T/S of the two thicknesses T and S that is sought, not their absolute values. To obtain the top film thickness T for the line width standard being certified, the thickness T of film 19 is optically measured during this stage of manufacture of the artifact, i.e. after the thermal growth of the film layer 19 and 20 in FIG. 1D but prior to removal of the top film portion 19 seen in FIG. 1E. Optical measurement can be done by means of optical interference with a microspectrophotometer for film thicknesses T down to about 10 nm, or more preferably by ellipsometry down to thicknesses T of about 2 nm. The microspectrophotometer or ellipsometer measurements must be performed with a calibrated instrument traceable to a recognized standard, for the derived value to be considered certified or traceable.

Figure 1E:
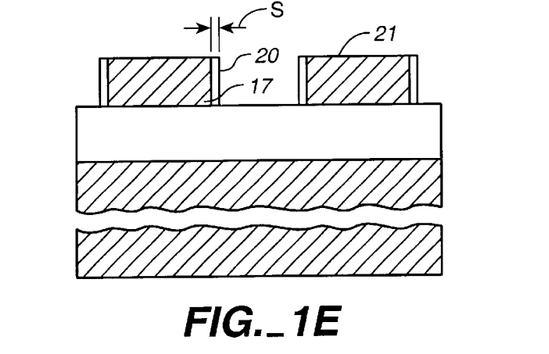
Figure 1F:
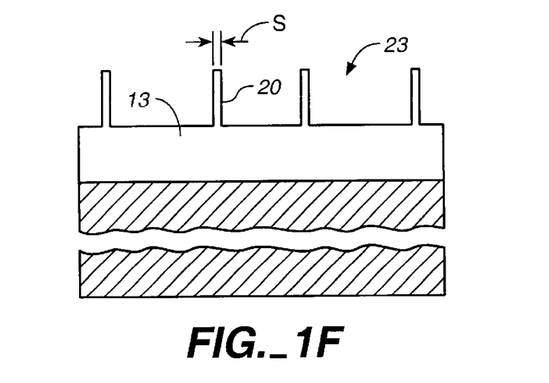

Referring to FIG. 1E, once measurement of the top oxide film 19 in FIG. 1D has been completed, the top film layer 19 is removed from the top surface 21 of the silicon strips 17 without removing any thickness of the film layer 20 from the side walls of the silicon strips 17. This can be accomplished by a chemical or chemical-mechanical planarization technique in which photoresist is first spin coated so as to completely fill the regions 18 between the silicon strips for protecting the side wall oxide film and the top film layer is then polished or etched away. After this, the silicon strips 17 are partially or completely removed without removing any of the side wall oxide film. For this step, a highly selective etchant is chosen. For example, tetramethyl ammonium hydroxide has a selectivity of 10000:1 for etching silicon verses etching silicon dioxide. This means that the entire 100 to 1000 nm thickness of silicon strips 17 can be completely removed without removing more than 0.01 to 0.10 nm of the silicon dioxide film layer 20. What remains after this etch, as seen in FIG. 1F, is the completed calibration standard. What were the silicon dioxide film layers 20 on the strip side walls form two or more isolated silicon dioxide lines 20 separated by regions 23 where the silicon strips 17 and inter-strip regions 18 used to be. The lines are thus spaced apart by at least about 20 $\mu$m and more typically 100 $\mu$m to several millimeters of separation. The lines have a line width that can be certified as equal to the calculated side wall film thickness, i.e. the known ratio T/S multiplied by the previously optically measured top film thickness. The lines 20 have a height that is substantially equal to the original silicon strip thickness. The lines height to width ratio can thus be as much as 20-to-1, but for structural integrity is preferably closer to one-to-one, e.g. 4-to-1 or less. Lines with the larger height-to-width aspect ratios can have some of the original silicon strip material 17 remaining to provide structural support. Alternatively, where silicon mounds of a square, rectangular, parallelogram, octagonal, or other polygonal shape are used instead of extended linear strips 17, the oxide side wall film layer 20 will form, after the silicon mound material has been selectively removed, connected thin linear segments of oxide material at locations corresponding to the perimeter of the silicon mounds, with the oxide linear segments having a width corresponding to the original side wall film thickness, as further described below.

While all of the lines in a given standard would ordinarily be of the same width dimension, it is possible to construct lines of different widths on the same artifact by altering the step seen in FIG. 1D. After a first thermal oxidation to form a first set of film coats 19 and 20 over silicon strips, some of the strips may be protected with a photoresist mask while the uncovered strips have their oxide film etched completely away from both top and side surfaces. Then a second oxide film is thermally grown so that now the surface has film layers 19 and 20 with different thicknesses on different silicon strips. Each set of film layers may be separately measured to determine their top thickness T. When the final standard is completed it will have lines with different widths S corresponding to the different oxide growth stages.

With reference to FIGS. 2A–2F, a method of making an artifact useful for determining the profile or shape of an atomic force microscope's probe tip is shown. (As used herein, "probe tip" means an AFM or SEM electron beam tip.) The steps of the manufacturing method closely follow that for the method in FIGS. 1A–1F for making the line width standard, except that the top surface of the silicon substrate 31 and the silicon layer 35 is the [100] crystal surface instead of the [110] silicon crystal top surface used for the line width standard. Accordingly, the silicon strip 37 will have sloping (instead of vertical) side walls.

Figure 2A:
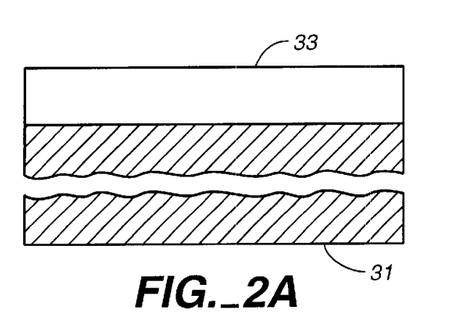
FIGS. 2A–2F are side sectional views showing a manufacturing process for a probe tip shape characterizing artifact of the present invention.
Figure 2B:
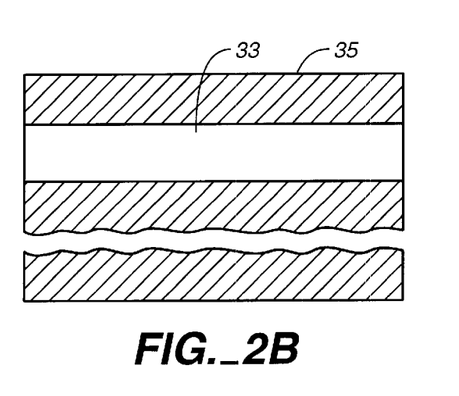
Figure 2C:
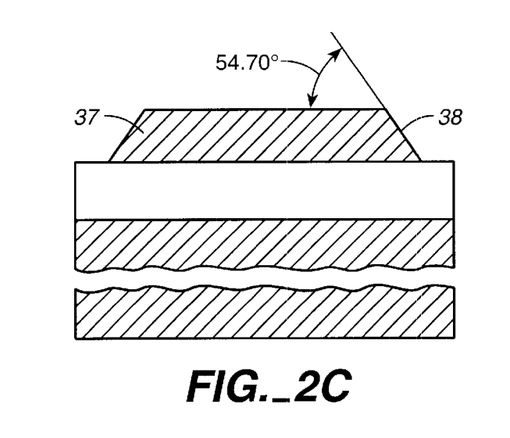
Figure 2D:
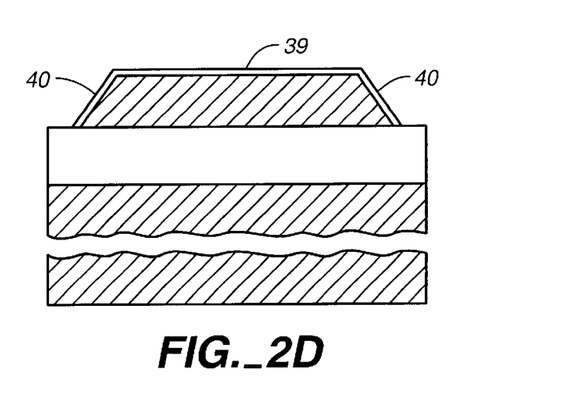
Figure 2E:
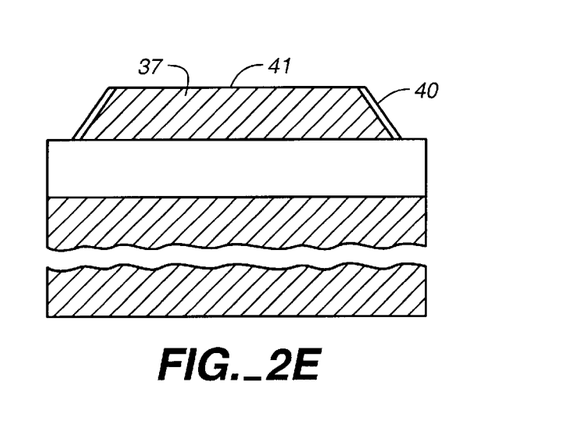

In FIGS. 2A and 2B, a silicon dioxide layer 33 is thermally grown on the [100] surface of a silicon substrate 31, and then a silicon layer 39 with a [100] top surface is bonded to or deposited over the silicon dioxide layer 33. The thickness dimensions of these layer can vary, but are typically the same as those mentioned above for the layers 11, 13 and 15 for making the line width standard in FIGS. 1A–1F. In particular, the layer 35 may be about 100 to 1000 nm thick. Next, by means of photolithography, patterning selected portions of the silicon layer 35 are defined and subsequently etched away to define at least one silicon strip 37. The strips 37 have a width of at least about 20 $\mu$m and typically on the order of several millimeters and are separated from any other strips 37 by a spacing of at least about 20 $\mu$m and again more typically by at least 100 $\mu$m up to several millimeters. The [111] crystal plane of the silicon strips' side walls 38 slope at approximately a 54.70° angle relative to the top [100] surface. The result of the photolithographically defined and etched step is seen in FIG. 2C. Alternatively, the silicon layer may form other shapes than extended linear strips, such as square, rectangular, parallelogram, octagonal or other polygonal mounds with 54.70° or 45° sloping perimeter walls defined by [111] or [110] crystal planes.

Next, a silicon dioxide film layer 39 and 40 is thermally grown on the silicon strip(s) or mound(s), including on the sloping side walls as film layer 40. The film layers typically have a thickness of at most 250 nm. In order to provide a well characterized probe tip profiling tool, the top surface film layer 39 may be optically measured to determine its thickness and the top-to-side thickness ratio may be determined by atomic force microscope or scanning electron microscope cross-section testing of cut samples, so that the sloping side wall thickness can be calculated, just as for the thin line width standard in FIGS. 1A–1F. Then the film layer 39 is removed from the top surface of the silicon strips 37 without removing any of the oxide film layer 40 from the sloping side walls. As before, this can be done by means of chemical or chemical-mechanical planarization techniques using an etch protective material, such as photoresist, to protect the side wall oxide film.

Figure 2F:
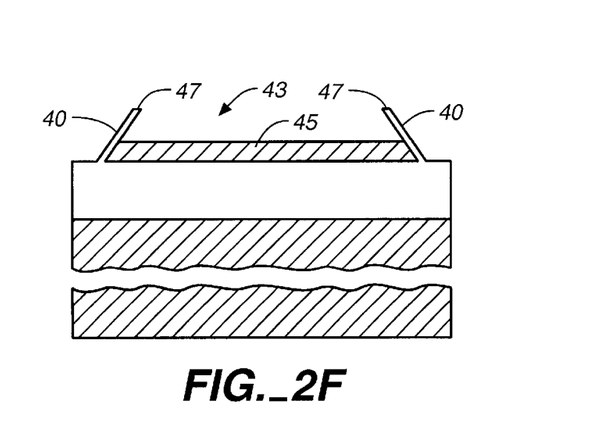

Finally, a portion (e.g., one-half) of the silicon strip material 37 is removed, using an etchant that is highly selective of silicon relative to silicon dioxide. The remaining silicon strip material 45 serves to provide stability to the oxide side wall film material 40 that now extends up)ward past the top surface of the remaining silicon 45. Thus, the silicon dioxide film material 40 from the sloping side walls form one or more pairs (one pair for each strip 37) of isolated, upward projecting, but 54.70° tilted and oppositely facing, fin-like members 40 separated by the space 43 where the silicon strip material 45 has been partially removed. The upper blade edge 47 of each fin-like member 40 forms a surface feature over which an atomic force microscope probe tip may pass to produce a signal representing the shape or profile of that probe tip.

Figure 3:
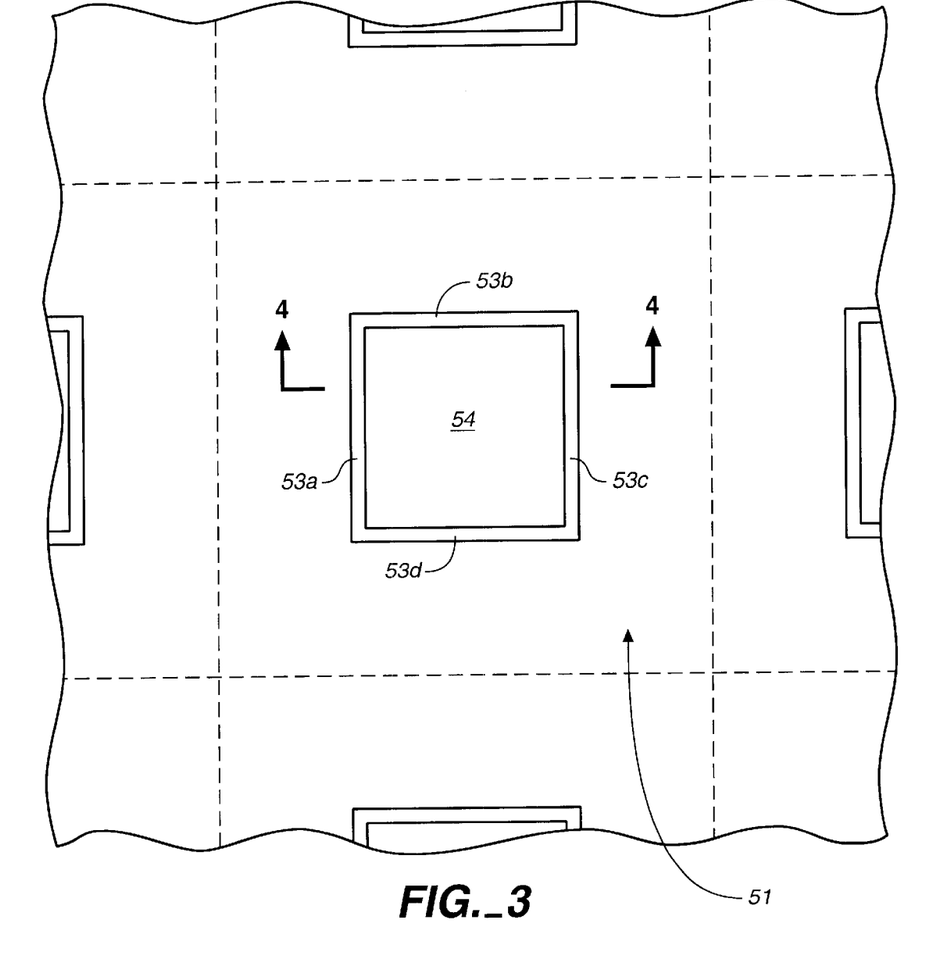
FIGS. 3, 5, 7, 8, and 9 are partial top plan views of alternative embodiments of calibration standard die in accord with the present invention.
Figure 4:
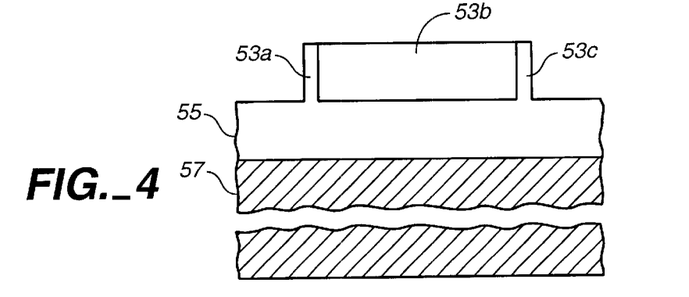
FIG. 4 and 6 are side sectional views taken along respective lines 4—4 and 6—6 in FIGS. 3 and 5.

With reference to FIGS. 3 and 4, the structures formed by the above described process steps need not be pairs of parallel lines, but could also assume other linear shapes, such as the connected linear segments of a polygon. In FIGS. 3 arid 4, the oxide line material forms a square or rectangle consisting of four segments 53a, 53b, 53c and 53d disposed on the silicon substrate 57 and silicon dioxide layer 55. Two of the segments 53a and 53d form parallel lines, segments oriented in a first direction, and the two other segments 53b and 53a form a second set of parallel line segments oriented in a second direction at right angles to the first direction. These thin oxide line segments are formed according to the method described above for FIGS. 1A–1F, but with square or rectangular silicon mounds used instead of extended linear strips 17. The silicon mound was located where the center region 54 is in FIG. 3, and the oxide side walls around the square or rectangular perimeter of that mound formed the oxide line segments 53a–53d once the mound material was selectively removed.

Figure 5:
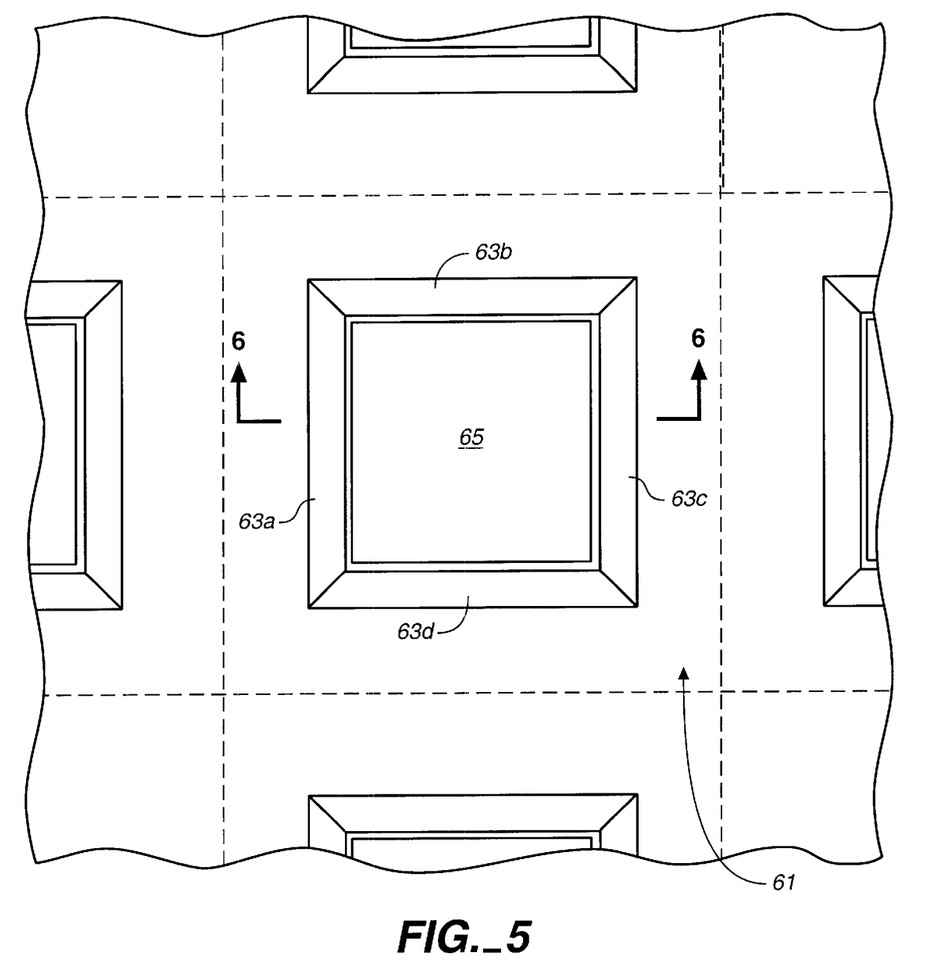
Figure 6:
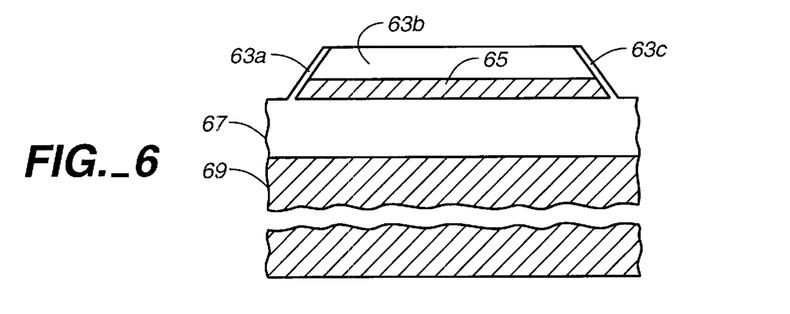

Likewise, in FIGS. 5 and 6, the upwardly projecting, but tilted, silicon dioxide blade or fin-like members 63a, 63b, 63c, 63d are arranged to form a square or rectangle over the silicon substrate 69 and first silicon dioxide layer 67. Some of the silicon mound material 65 may remain in the center region 65 to provide additional structural integrity to the oxide fins. This structure is formed according to the method described in FIGS. 2A–2F, with the extended linear strips being replaced by square or rectangular mounds. The mounds have sloping side walls on which the sloping oxide fin material is grown.

Figure 7:
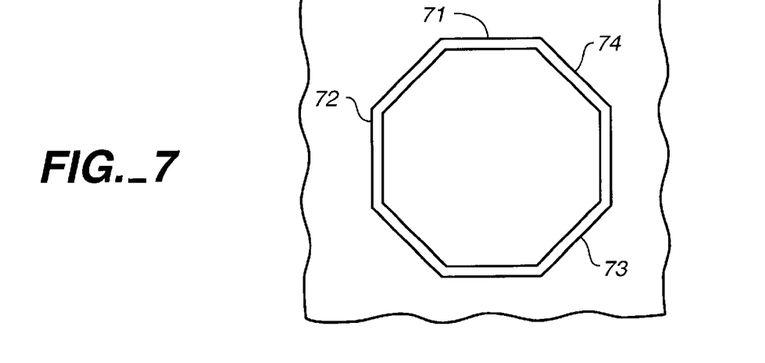
Figure 8:
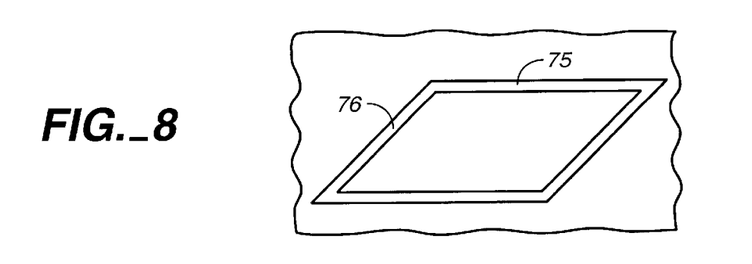

Both of those square or rectangular oxide structures permit instrument testing in two orthogonal directions without having to reorient the standard artifact. Other possible configurations include line segments connected into the shape of an octagon (FIG. 7) or parallelogram (FIG. 8), which include both orthogonal and 45° diagonal line orientations, as seen by the segments 71–76. The line orientations which would normally be produced are dictated in part by the limited added usefulness of an,(other orientation beyond the orthogonal (0° and 90°) and 45° diagonal ones already mentioned, and also by the easier and better quality production of surfaces which are oriented along crystal planes of the silicon layer material.

Figure 9:
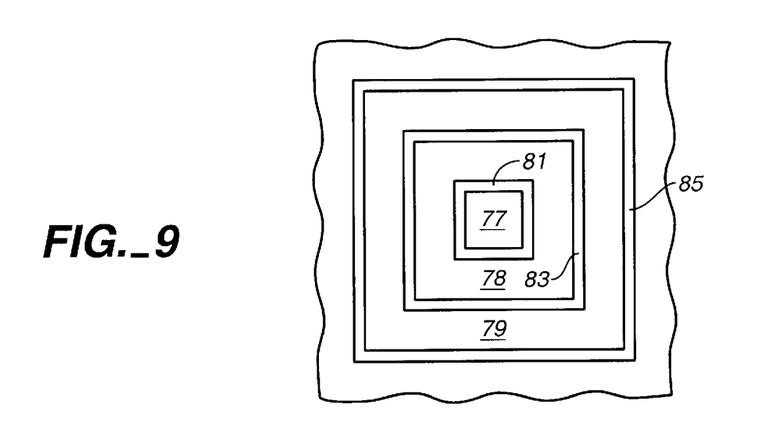

The linear features, whether formed as extended, parallel lines or as polygonal segments can be laid out on each die in an array or matrix arrangement, or concentrically in a manner like that shown in FIG. 9. The concentric configuration of three square perimeter oxide line features 81, 93 and 85 can be formed according to the above described methods when a central square silicon mound is located in region 77 and a "toroidal" square perimeter region 79 of silicon, created by removal of the silicon layer material from region 78, is also formed. The concentric linear features 81, 83 and 85 are the side wall oxide material that remains after the silicon has finally been removed from regions 77 and 79. In addition to being useful for calibration or probe characterization of atomic force and scanning electron microscope systems in two orthogonal directions (x-y), or in both orthogonal and diagonal directions for concentric octagonal features, the concentric arrangement can be used to check astigmatism of deep UV optical profilometers.

Figure 10:
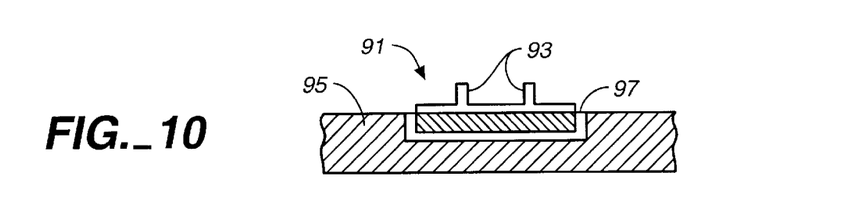
FIG. 10 is a side view of a calibration standard die according to the present invention mounted on a carrier for ease of handling.

With reference to FIG. 10, for ease in handling the standard artifact, the die can be mounted on a carrier substrate. In particular, numerous 10 mm square die are typically fabricated on a 100 mm diameter (525 µm thick) wafer, with one set of features per die. Each individual die 91 is then cut from the wafer using well known techniques and mounted onto a larger substrate or carrier 95, with typical one die, but possibly as many as four different dice with distinct features 93, per carrier. For example, the carrier may comprise a 200 mm diameter (725 µm thick) or an even larger 300 mm diameter silicon wafer, or alternatively could be a 50 mm square (6µm thick) quartz block. The carrier may be prepared by etching a shallow depressed region or well 97 substantially matching the size and shape of the die so as to form a seat for the die. Other mounting techniques could also be used.

What is claimed is:

1. A method of making an artifact constituting a line width standard for calibration of line width measuring instruments, comprising:
    forming a silicon dioxide layer over a silicon substrate;
    adding a silicon layer over the silicon dioxide layer;
    removing selected portions of the silicon layer to form one or more silicon regions;
    thermally growing a silicon dioxide film layer on the silicon regions, wherein the silicon dioxide film layer is grown on a top surface and side walls of the silicon regions;
    removing the silicon dioxide film layer from the top surface of the silicon regions; and
    removing at least some of the silicon regions such that the silicon dioxide film layer from the side walls of the silicon regions comprises linear features.

2. The method of claim 1, wherein the silicon substrate has a [110] top surface.

3. The method of claim 1, wherein the silicon layer has a thickness in a range from about 20 nm to about 100 nm.

4. The method of claim 1, wherein removing selected portions of the silicon layer comprises removing the selected portions with an etchant having orientation-dependent etching properties such that the side walls of the silicon regions comprise [111] silicon crystal surface planes.

5. The method of claim 1, wherein thermally growing the silicon dioxide film layer comprises using a dry oxidation technique.

6. The method of claim 1, wherein a thickness of the silicon dioxide film layer is at least one-fourth of the thickness of the silicon regions.

7. The method of claim 1, wherein removing the silicon dioxide film layer from the top surface of the silicon regions comprises a planarization technique using an etch protective material between the silicon regions to protect the silicon dioxide film layer on the side walls of the silicon regions from removal.

8. The method of claim 1, wherein removing at least some of the silicon regions comprises using an etchant that is highly selective to silicon relative to silicon dioxide, and wherein the etchant is a tetramethylammonium hydroxide-based etchant.

9. The method of claim 1, wherein thermally growing the silicon dioxide film layer comprises a multi-stage growth, selective removal, and regrowth process such that film layers on different silicon regions have different thicknesses.

10. The method of claim 1, wherein the silicon regions comprise a width of at least about 20 µm, wherein a spacing between each of the silicon regions is at least about 20 µm, wherein the silicon regions comprise extended silicon strips, and wherein the linear features comprise lines spaced apart by distances corresponding to the width and the spacing of the silicon regions.

11. The method of claim 1, wherein the one or more silicon regions comprise polygonal silicon mounds, and wherein the linear features comprise connected line segments at former perimeter locations of the polygonal silicon mounds.

12. The method of claim 1, wherein the one or more silicon regions comprise a central silicon region and one or more spaced apart concentric silicon regions surrounding the central silicon region, and wherein the silicon dioxide linear features are concentrically arranged.

13. The method of claim 1, wherein the silicon dioxide film layer has a thickness on the side walls of a known correlation to a thickness of the silicon dioxide film layer on the top surface, and wherein the thickness of the silicon dioxide film layer on the side walls can be determined from the known correlation and a thickness of the silicon dioxide film layer on the top surface measured prior to removal of the silicon dioxide film layer on the top surface.

14. The method of claim 1, wherein the silicon layer comprises a [110] top surface.

15. The method of claim 1, wherein the silicon regions comprise a width of at least about 20 µm, and wherein a spacing between each of the silicon regions is at least about 20 µm.

16. The method of claim 1, wherein removing at least some of the silicon regions comprises using an etchant that is highly selective to silicon relative to silicon dioxide.

17. The method of claim 1, wherein the linear features have a line width of less than about 500 nm.

18. A method of making an artifact for determining the shape of a scanning microscope probe tip, comprising:
    forming a silicon dioxide layer over a silicon substrate;
    adding a silicon layer over the silicon dioxide layer;
    removing selected portions of the silicon layer to form at least one silicon region with sloping side walls;
    thermally growing a silicon dioxide film layer on at least the one silicon region, wherein the film layer is grown on a top surface and the sloping side walls of at least the one silicon region; removing the film layer from the top surface of at least the one silicon region; and
    removing a portion of at least the one silicon region such that the silicon dioxide film layer from the side walls of at least the one silicon region forms at least two isolated upward projecting silicon dioxide members, wherein an upper edge of the members forms a surface feature on the artifact over which the probe tip can pass such that a signal representative of the shape of the probe tip can be produced.

19. The method of claim 18, wherein the silicon substrate has a [100] top surface.

20. The method of claim 18, wherein the silicon layer has a thickness in a range from about 100 nm to about 100 nm.

21. The method of claim 18, wherein the sloping side walls of at least the one silicon region are formed along [111] silicon crystal surface planes of the silicon layer, and wherein the sloping side walls are formed at an angle of about 54.7° relative to the top surface of at least the one silicon region.

22. The method of claim 18, wherein thermally growing the silicon dioxide film layer comprises using a dry oxidation technique.

23. The method of claim 18, wherein removing the film layer from the top surface of at least the one silicon region comprises a planarization technique using an etch protective material adjacent to at least the one silicon region to protect the film layer on the side walls from removal.

24. The method of claim 18, wherein removing the portion of at least the one silicon region comprises using an etchant that is highly selective to silicon relative to silicon dioxide, and wherein the etchant is a tetramethylammonium hydroxide-based etchant.

25. The method of claim 18, wherein at least the one silicon region comprises a width of at least about 20 µm, wherein a spacing between at least the one silicon region and an adjacent silicon region is at least about 20 µm, wherein at least the one silicon region comprises an extended silicon strip, and wherein the linear features comprise lines spaced apart by distances corresponding to the width and the spacing of at least the one silicon region.

26. The method of claim 18, wherein at least the one silicon region comprises a polygonal silicon mound, and wherein the members formed by removing the portion of at least the one silicon region comprise line segments connected at perimeter locations of the polygonal silicon mound.

27. The method of claim 18, wherein at least the one silicon region comprises a central silicon region and one or more spaced apart concentric silicon regions surrounding the central silicon region, and wherein the members are concentrically arranged.

28. The method of claim 18, wherein the silicon layer comprises a [100] upper surface.

29. The method of claim 18, wherein at least the one silicon region comprises a width of at least about 20 µm, and wherein a spacing between at least the one silicon region and an adjacent silicon region is at least about 20 µm.

30. The method of claim 18, wherein removing the portion of at least the one silicon region comprises using an etchant that is highly selective to silicon relative to silicon dioxide.

31. The method of claim 18, wherein the silicon dioxide film layer has a thickness on the side walls of a ratio to a thickness of the silicon dioxide film layer on the top surface, and wherein the thickness of the silicon dioxide film layer on the side walls can be determined from the ratio and a thickness of the silicon dioxide film layer on the top surface measured prior to removal of the silicon dioxide film layer on the top surface.

32. A method of certifying a line width artifact of a line width standard, comprising:

determining the ratio between a thickness of a silicon dioxide film layer formed on side walls of silicon regions of sample artifacts and a thickness of the silicon dioxide film layer formed on a top surface of the silicon regions of the sample artifacts, wherein the sample artifacts are formed by a process used to form the line width standard;

measuring the thickness of a silicon dioxide film layer formed on a top surface of a silicon region formed on the line width standard;

determining the thickness of a silicon dioxide film layer formed on side walls of the silicon region of the line width standard using the measured thickness of the silicon dioxide layer formed on the top surface of the silicon region on the line width standard and the determined ratio;

removing the silicon dioxide film layer from the top surface of the silicon region on the line width standard;

removing at least some of the silicon region on the line width standard such that the remaining silicon dioxide film layer from the side walls comprises linear features; and certifying the line width artifact of the line width standard to be the determined thickness of the linear features.

33. The method of claim 32, wherein the process used to form the line width standard comprises:

forming a silicon dioxide layer over a silicon substrate;

adding a silicon layer over the silicon dioxide layer;

removing selected portions of the silicon layer to form one or more silicon regions; and thermally growing a silicon dioxide film layer on the one or more silicon regions.

34. The method of claim 32, wherein determining the ratio comprises:

cutting the sample artifacts such that a cross-section of the silicon region and the film layer formed on the top surface and the side walls of the silicon region is exposed; and examining the exposed cross-section of at least one of the sample artifacts to measure a film thickness ratio of the film layer on the top surface of the silicon region to the film layer on the side walls of the silicon region.

35. The method of claim 34, wherein examining the exposed cross-section comprises using an atomic force microscope to measure the film thickness ratio.

36. The method of claim 34, wherein examining the exposed cross-section comprises using an electron microscope to measure the film thickness ratio.

37. The method of claim 34, wherein determining the thickness of the silicon dioxide film layer formed on the side walls comprises multiplying the measured film thickness ratio by the measured thickness of the silicon dioxide film layer formed on the top surface of the silicon regions on the line width standard.

38. The method of claim 32, wherein measuring the thickness comprises using an optical interference technique with a microspectrophotometer.

39. The method of claim 32, wherein measuring the thickness comprises using an ellipsometer.

40. The method of claim 32, wherein the silicon regions comprise extended strips, and wherein the linear features comprise spaced apart extended lines.

41. The method of claim 32, herein the silicon regions comprise polygonal mounds, and wherein the linear features comprise line segments arranged such that the line segments connect to form a polygon.

42. The method of claim 32, wherein the silicon regions and the silicon dioxide linear features are concentrically arranged.

43. The method of claim 32 wherein the silicon layer comprises a [110] top surface.

44. The method of claim 32, wherein the silicon regions comprise a width of at least about 20 µm, and wherein a spacing between each of the silicon regions is at least about 20 µm.

* * * * *

UNITED STATES PATENT AND TRADEMARK OFFICE
CERTIFICATE OF CORRECTION

PATENT NO. : 6,358,860 B1
DATED : March 19, 2002
INVENTOR(S) : Scheer et al.

It is certified that error appears in the above-identified patent and that said Letters Patent is hereby corrected as shown below:

Column 8,
Line 58, after the phrase "a thickness in a range from about 100 nm to about" please delete "100" and substitute therefor -- 1000 --.

Signed and Sealed this

Twenty-second Day of October, 2002

Attest:

JAMES E. ROGAN
Attesting Officer  Director of the United States Patent and Trademark Office